(12) United States Patent
Gharpurey et al.

(10) Patent No.: US 7,062,244 B2
(45) Date of Patent: Jun. 13, 2006

(54) SPEED-UP MODE IMPLEMENTATION FOR DIRECT CONVERSION RECEIVER

(75) Inventors: Ranjit Gharpurey, Plano, TX (US);
Naveen K. Yanduru, Dallas, TX (US);
Petteri Litmanen, Dallas, TX (US);
Francesco Dantoni, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 282 days.

(21) Appl. No.: 10/032,638

(22) Filed: Dec. 28, 2001

(65) Prior Publication Data

US 2003/0125000 A1    Jul. 3, 2003

(51) Int. Cl.
*H04B 1/06*    (2006.01)

(52) U.S. Cl. ............... 455/242.1; 455/247.1; 455/250.1; 375/345

(58) Field of Classification Search .......... 455/234.1, 455/234.2, 241.1, 241.2, 242.1, 242.2, 250.1, 455/266, 339, 340; 375/345
See application file for complete search history.

(56) References Cited

U.S. PATENT DOCUMENTS

| | | | | |
|---|---|---|---|---|
| 4,457,007 A | * | 6/1984 | Gutleber | 375/349 |
| 4,697,098 A | * | 9/1987 | Cloke | 327/79 |
| 4,811,423 A | * | 3/1989 | Eastmond | 455/203 |
| 5,513,387 A | * | 4/1996 | Saito et al. | 455/243.1 |
| 5,677,962 A | * | 10/1997 | Harrison et al. | 381/109 |
| 5,805,212 A | | 9/1998 | Fujiwara | 348/208 |
| 5,909,243 A | * | 6/1999 | van Acquoij | 348/222.1 |
| 6,243,569 B1 | | 6/2001 | Atkinson | 455/324 |
| 6,366,765 B1 | * | 4/2002 | Hongo et al. | 455/161.1 |
| 6,498,927 B1 | * | 12/2002 | Kang et al. | 455/245.2 |
| 6,560,447 B1 | * | 5/2003 | Rahman et al. | 455/232.1 |
| 6,741,844 B1 | * | 5/2004 | Medvid et al. | 455/232.1 |
| 6,843,597 B1 | * | 1/2005 | Li et al. | 375/345 |
| 2003/0026363 A1 | * | 2/2003 | Stoter et al. | 375/345 |

FOREIGN PATENT DOCUMENTS

WO    WO0124352 A1    4/2001

* cited by examiner

*Primary Examiner*—Nguyen T. Vo
*Assistant Examiner*—Nhan T. Le
(74) *Attorney, Agent, or Firm*—Alan K. Stewart; W. James Brady, III; Frederick J. Telecky, Jr.

(57) ABSTRACT

A speed-up mode control system is operative to generate a speed-up mode signal based on a gain control signal from associated digital circuitry. The speed-up mode signal controls electronics associated with one or more amplifiers to facilitate settling time of an output signal of the amplifier(s) that occurs when the gain of the amplifier changes. The gain control signal also can be delayed to provide a delayed version of the gain control signal for controlling gain of the amplifier(s).

21 Claims, 4 Drawing Sheets

SPEED-UP MODE IMPLEMENTATION FOR DIRECT CONVERSION RECEIVER

TECHNICAL FIELD

The present invention relates generally to radio communications and, more particularly, to implementing a speed-up mode for a direct conversion receiver.

BACKGROUND OF THE INVENTION

Various approaches exist for receiving and converting an input radio frequency (RF) signal to a desired frequency. Of particular interest are direct conversion receivers. A direct conversion receiver mixes directly to a baseband signal without converting the input RF signal to an intermediate frequency, as is the case in a superheterodyne receiver. That is, a direct conversion receiver converts the incoming radio signal to baseband in a down-conversion step, wherein an associated local oscillator operates at a frequency that coincides with the center of the input RF signal. Direct conversion receivers can be implemented in connection with various communications protocols, such as, for example, the Universal Mobile Telecommunications System (UMTS), General Packet Radio System (GPRS) and Global System for Mobile (GSM)-based wireless communications devices and the like.

For reasons of lowered cost, improved yield and lower power dissipation, most of the receiver gain usually is implemented in a baseband section of the receiver by the use of amplifiers. In order to compensate for large variation in received signal amplitude in wireless environments, the receiver gain usually is variable.

DC offsets are inherent in any amplifier and can arise from sources such as device mismatches. If amplifier stages in a receiver are DC coupled, the receiver can saturate due to the DC offset of the amplifiers. In order to implement a high gain in baseband, it thus becomes important to AC couple the amplifier stages. For example, if the baseband gain is 60 dB, and the input offset on the first amplifier in the baseband is 10 mV, and the supply voltage is 3 V, the output will be limited to the supply, and, if the amplifiers are DC coupled, the receiver would not be able to provide desired linear amplification of the input signal. This would be unsatisfactory in a receiver.

AC coupling can be accomplished either by placing explicit active high-pass filers in between the amplifiers, or otherwise by simply using coupling capacitors in between gain stages. In either case, the filter is characterized by a zero at DC and a pole at the high-pass transition corner of the filter. This corner generally cannot be made too large, as the down-converted signal itself is at DC. Hence, as the corner frequency is increased, there is a corresponding loss in signal power. The corner frequency thus can be set by determining an acceptable signal loss at low frequencies. For example, in WCDMA (Wideband Code Division Multiplexing) systems, the signal bandwidth is approximately 2 MHz. Accordingly, a high-pass corner frequency of about 10 kHz would be acceptable.

A problem with such a low high-pass corner frequency is that the settling response time of the filter may not be acceptable. By way of illustration, continuing with the above example having a baseband gain of 60 dB, assume that the amplifier is implemented as a cascade of three capacitively coupled variable gain amplifiers, each providing a maximum gain of 20 dB, where each capacitor has an associated high-pass corner of 10 kHz. If the input offset in such a case is 10 mV, and the gain of the input amplifier is switched from 0 to 20 dB, this would cause an instantaneous glitch of about 100 mV at the output of the first amplifier, a 1 V glitch at the output of the second amplifier, and drive the third amplifier into saturation (e.g., a clipped state). For purposes of this example, assume linear settling, which provides a settling time for the amplifiers of about 300 µS (assuming an acceptable settling performance of 3t, where t is the time constant of the filter). The implication of the above is that for a period of several ten or hundreds of microseconds, after application of a gain control command, the output is unusable. By most conventional communication standards, this would be unacceptable.

A known technique around this problem is to anticipate the application of the gain control step and to temporarily increase the high-pass corner frequency of the filter, known as a speed-up mode. The temporary increase in the corner frequency enables glitches generated by the gain step to settle more quickly. After the glitch settles, the filter is returned to its original state that has a low-corner frequency.

FIG. 1 illustrates a conventional implementation of a direct conversion receiver 10 implementing a speed-up mode. The receiver 10 includes a DSP 12 that provides a speed up control signal 14 to the analog section 16 via a control line to implement desired speed-up mode control. The speed-up control signal 14 is provided to high-pass filters 18 of the analog section 10. The DSP 12 also provides a gain control signal 20 to amplifiers 22 of the analog section 12 via a separate control line to implement variable gain control. Each control line usually requires a separate pin on the integrated circuitry. The analog section 16 provides output signal to the DSP 12 through associated A/D converters 24. The receiver also includes a receiver front end 26 that receives an input RF signal from an antenna 28. Because the gain control is determined in the DSP 12, the DSP can anticipate its application and provide suitable control information to the analog filters to implement desired speed-mode.

An example of a timing diagram for signals provide on control lines from the digital section is shown in FIG. 2. The gain control signal $V_{gc}$ is illustrated as three levels. The speed-up control signal is illustrated as including a pulse with a high level for each change in gain control signal $V_{gc}$.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the present invention relates to a speed-up control system, such as that can reside in an analog portion of a direct conversion receiver. The speed-up control system is operative to generate a speed-up control signal in response to changes in a gain control input signal. The speed-up control signal is used to control filter characteristics of an associated filter arranged to filter the output of the one or more amplifiers.

The gain control input signal can also be employed to implement gain control of one or more amplifiers, such as by imposing delay on the input gain control signal and providing the delayed gain control signal to one or more amplifiers. In a particular aspect of the present invention, the speed-up control signal and signal used to implement gain control are derived from a common input gain control signal, such as provided by associated digital circuitry. Accordingly, the present approach reduces the number signals need from associated digital circuitry to implement gain control and speed-up control and thus helps to remove the number of package pins required for the receiver.

Another aspect of the present invention provides a method for implementing speed-up mode control for an analog portion of a direct conversion receiver. The method includes differentiating an input gain control signal to provide a differentiated signal. A pulse is then generated based on the differentiated signal indicating a change in the input gain control signal.

The following description and the annexed drawings set forth in certain illustrative aspects of the invention. These aspects are indicative, however, of but a few ways in which the principles of the invention may be employed. Other advantages and novel features of the invention will become apparent from the following detailed description of the invention when considered in conjunction with the drawings.

DETAILED DESCRIPTION OF THE INVENTION

Figure 1:
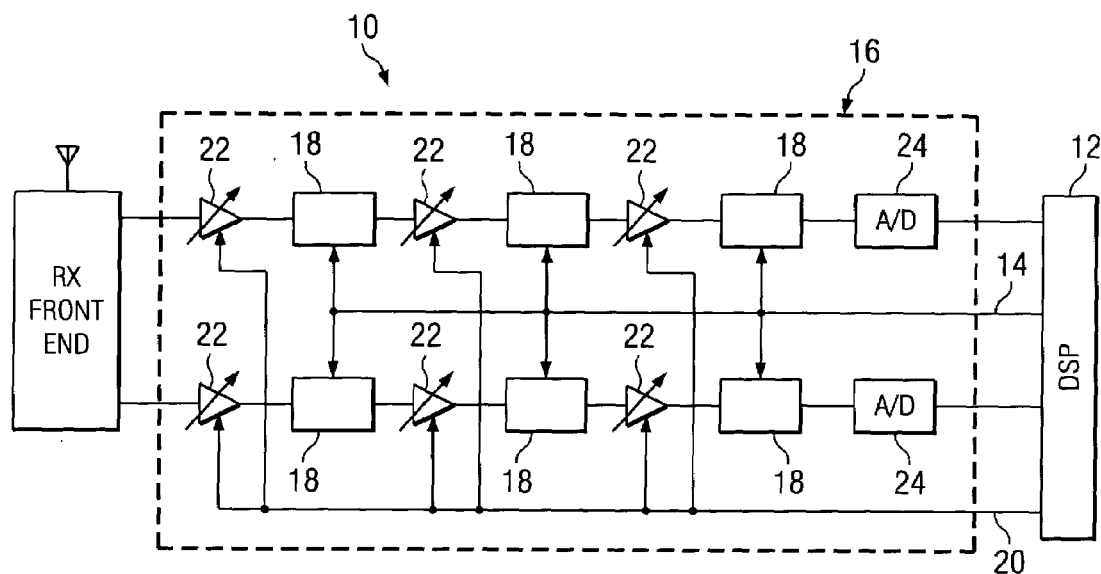
FIG. 1 is an example of a conventional direct conversion receiver.
Figure 2:
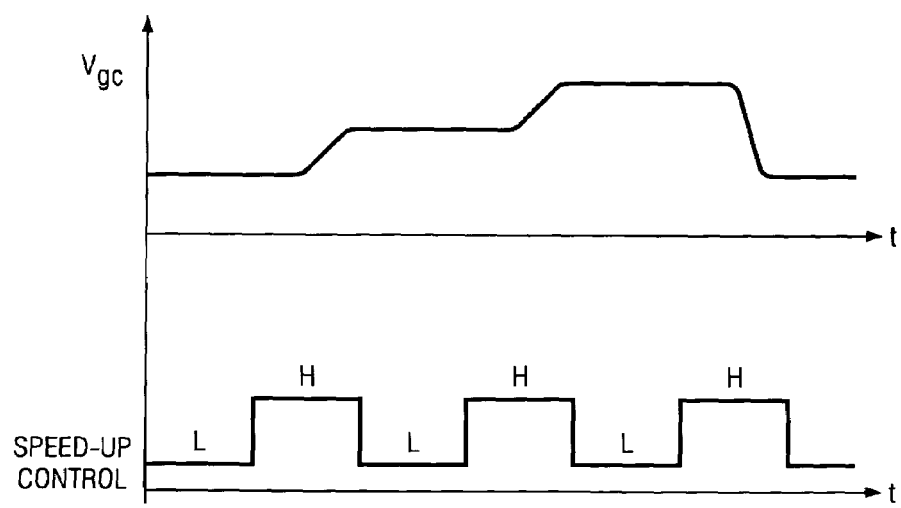
FIG. 2 is a timing diagram for control signals associated with the direct conversion receiver of FIG. 1.
Figure 3:
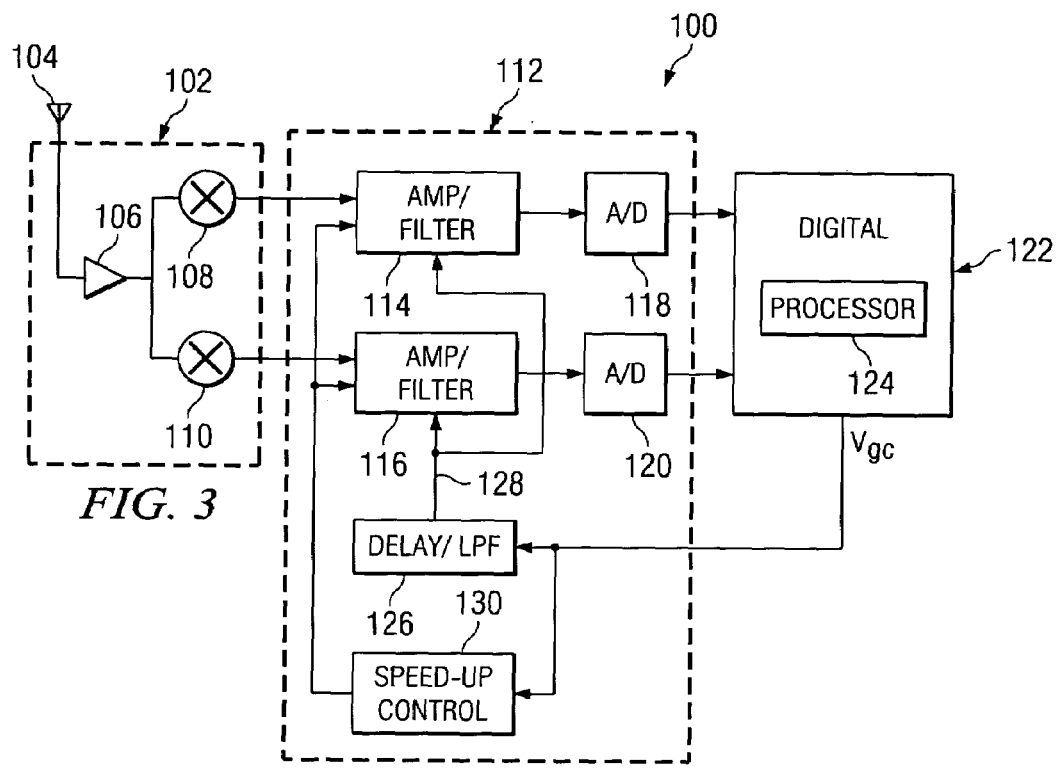
FIG. 3 is a block diagram of a direct conversion receiver in accordance with an aspect of the present invention.

FIG. 3 illustrates a block diagram of a receiver 100 programmed and/or configured to implement speed-up mode control in accordance with an aspect of the present invention. The receiver 100 includes a receiver front end 102 operative to receive an input RF signal from an associated antenna 104. The receiver front end 102 includes an amplifier/filter network 106 for amplifying the input signal to a desired level and removing unwanted noise. The amplifier/filter network receives an output signal from mixers 108 and 110. Each of the mixers 108 and 110 is associated with a local oscillator (not shown) to mix the filtered input signal with a desired phase shift. For example, the mixers 108 and 110 provide mixed signals that have a relative phase shift of 90 degrees (e.g., quadrature related mixers). By way of illustration, one of the mixed signals can have a 90 phase shift while the other mixed signal has a 0 degree phase shift. Alternatively, one might have a −45 degree phase shift and the other a +45 degree phase shift.

The mixers 108 and 110 provide the mixed signals to an analog baseband section 112 configured in accordance with an aspect of the present invention. In particular, the mixed signals are provided to respective filter/amplifier networks 114 and 116. For example, the filter/amplifier networks 114 and 116 can include an arrangement of one or more serially connected amplifier and filter stages. Each of the amplifiers is operative to implement variable gain according to a gain control signal. Each of the filters, which can be High-Pass Filters (HPFs) are operative to implement more than one operating mode having different filtering characteristics. For example, the HPFs can operate in a one mode having a first corner frequency and in a second mode having a second corner frequency, which that is higher than the first corner frequency. The operating mode of the filters is determined by a speed-up mode control signal. The filter/amplifier networks 114 and 116 provide filtered, amplified signals to associated analog-to-digital (A/D) converters 118 and 120. The A/D converters 118 and 120 convert the filtered, amplified signals to corresponding digital signals that are provided to a digital baseband section 122 of the receiver 100.

Figure 4:
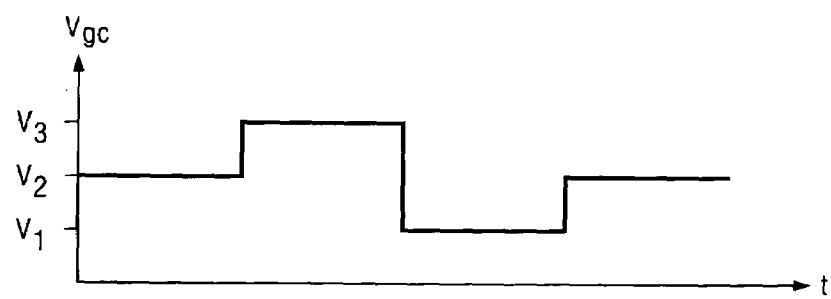
FIG. 4 is a timing diagram for a gain control signal.

The digital baseband section 122 includes a digital processor 124 programmed and/or configured to determine appropriate gain control for the amplifiers of the HPF/amplifier networks 114 and 116. An example of a typical gain control signal $V_{gc}$ is illustrated in FIG. 4. As shown in FIG. 4, the control signal $V_{gc}$ is quiet for most of the period and periodically changes at rate specified by the receiver system 100 (FIG. 3). In general, the ramp time of the gain control signal $V_{gc}$ is relatively small when compared to the periodicity of its change. The gain control signal $V_{gc}$ can have two or more different levels for implementing different gain at the amplifiers of the networks 114 and 116.

Referring back to FIG. 3, the digital section 122 provides the gain control signal $V_{gc}$ to the analog section 112. In particular, the gain control signal $V_{gc}$ is provided to a delay/Low-Pass Filter (LPF) component 126. For example, the delay/LPF component 126 could be implemented as a LPF or as other circuitry operative to implement a desired amount of delay relative to the gain control signal $V_{gc}$. The delay/LPF component 126 provides a delayed version of the gain control signal $V_{gc}$, indicated at 128, to amplifiers of the filter/amplifier networks 114 and 116. When the delayed gain control signal 128 changes levels, desired gain control is implemented at respective variable gain amplifiers of the HPF/amplifier networks 114 and 116. However, for a short time period proximate to changes in the gain control signal $V_{gc}$, glitches can occur in response to changing the gain of the respective amplifiers. The glitches can render the output of the amplifiers unusable if appropriate corrective action is not taken.

The gain control signal $V_{gc}$ is also provided to a speed-up control component 130 of the analog section 112 in accordance with an aspect of the present invention. The speed-up control 130 is operative to provide a speed-up control signal to filters of the networks 114 and 116 to mitigate glitches typically associated with changes in the gain of the amplifiers of the networks. For example, the speed-up control 126 provides a pulse having a duration that temporarily increases the high-pass corner frequency of the filter so as to operate in a speed-up mode. The duration of the pulse maintains the filter in the speed-up mode for a time period sufficient to help glitches generated in response to changes in gain to settle quickly. After the glitch settles (and the pulse ends), the filter is returned to its normal operating mode having a lower corner frequency. Alternatively, the speed-up control signal (e.g., pulse) could be employed to activate other associated circuitry (not shown) to temporarily dampen and/or mitigate glitches in the amplifier output signal due to changing the gain of the respective amplifiers.

Figure 5:
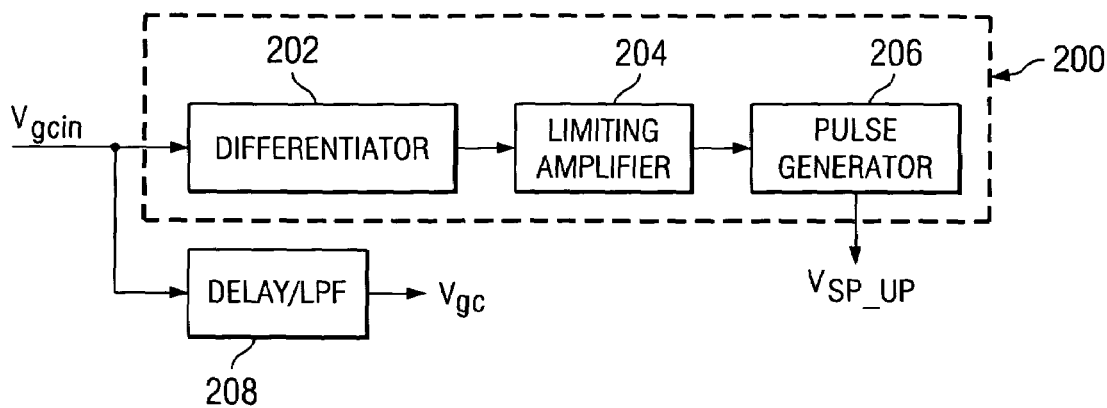
FIG. 5 is an example of a speed-up control system in accordance with an aspect of the present invention.

FIG. 5 is a block diagram illustrating an example of speed-up control system 200 in accordance with an aspect of the present invention. The speed-up control system 200 includes a differentiator 202 that receives an input gain control signal $V_{gcin}$, such as from a digital section of a direct conversion receiver. The differentiator 202 produces a spike as a function of a change in the gain control signal $V_{gcin}$, which can be a change from a LOW to HIGH level or a HIGH to LOW level. It is to be appreciated that the gain control signal $V_{gcin}$ also can have more than two associated levels, such that a change can include a change between any of its levels. For example, the gain control signal increases or decreases in discrete steps, with the number of possible levels being determined by the total range of gain that can be varied, and the gain change per unit step of the control voltage.

The differentiator 202 provides the differentiated signal (e.g., spike) to a limiting amplifier 204 that amplifies the differentiated signal to a useable level. Thus, when the gain control signal $V_{gcin}$ changes levels, the amplifier 204 provides a corresponding amplified spike signal to an associated pulse generator 206. The pulse generator 206 produces a pulse of a desired fixed duration, which can be used as a speed-up mode control signal, namely, a speed-up control signal $V_{spd\_up}$.

By way of example, the pulse generator 206 can be a monoshot oscillator or other circuitry capable of producing a pulse of a desired fixed duration. In accordance with an aspect of the present invention, the duration of the pulse is selected to operate an associated filter in a speed-up mode, such as by causing the filter to employ a higher corner frequency for a time period generally commensurate with the duration of the pulse. Also, where different types or characteristics of filters are employed to filter amplified signals in the receiver, one or more pulse generators can be arranged to provide different pulses to the respective filters according to their respective filter parameters. It is also to be appreciated that, in accordance with an aspect of the present invention, the pulse from the pulse generator 206 also could be employed to activate other associated circuitry (not shown) to facilitate settling of amplifier output signals that can occur when the gain of the respective amplifiers changes.

The gain control signal $V_{gcin}$ is also passed through delay/LPF circuitry 208 configured for imposing a delay associated with a change in the level of the gain control signal $V_{gcin}$. The amount of delay can be set to generally correspond to processing time required to generate the speed-up control signal based on the gain control signal $V_{gcin}$. The delay/LPF circuitry 208 outputs a gain control signal $V_{gc}$ that is applied to a gain control line of one or more variable gain amplifiers. Thus, the delayed gain control signal $V_{gc}$ controls the gain of the amplifier. The delay/LPF circuitry 208, for example, can be implemented as linear analog delay circuitry or as a low-pass filter.

In accordance with an aspect of the present invention, the speed-up control system 200 is implemented as part of the analog section of a receiver. As a result, the speed up mode can be implemented without the need for an explicit speed-up control signal from the digital section of the receiver. Because the speed-up control signal and delayed gain control signal $V_{gc}$ are derived within the analog section of the receiver based on a common gain control signal $V_{gcin}$ from the digital section, fewer pins further are required as compared to conventional approaches.

Figure 6:
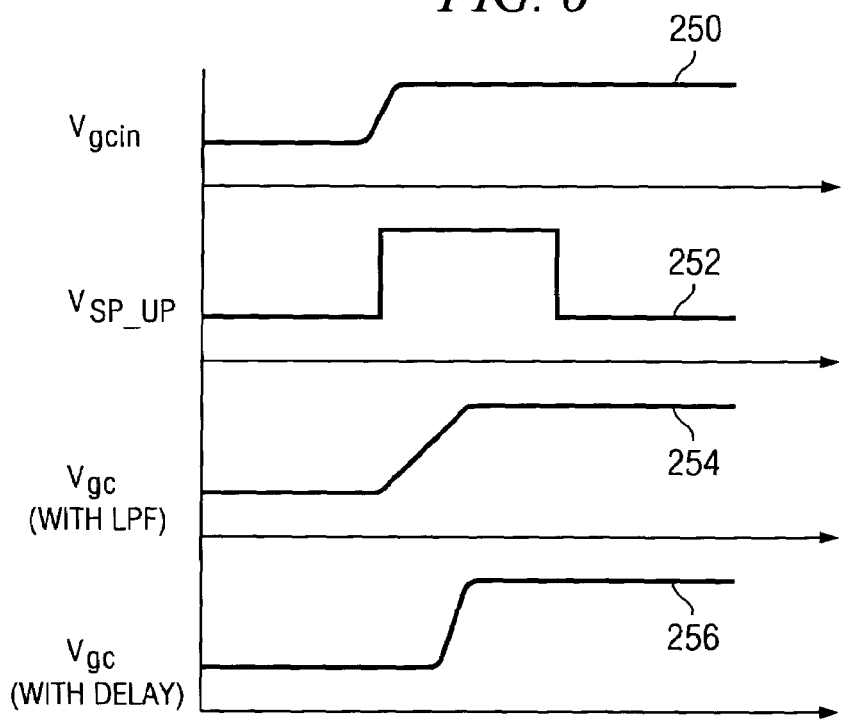
FIG. 6 is a timing diagram for various signals in a speed-up control system in accordance with an aspect of the present invention.

FIG. 6 illustrates an example of a timing diagram for input and output signals associated with operation of a speed-up control in accordance with an aspect of the present invention. FIG. 6 illustrates an input gain control signal 250 is illustrated as changing from a LOW-LEVEL V1 to a HIGH-level V2. The rate of change of the gain control signal $V_{gcin}$ can be selected according to system parameters and performance characteristics of the amplifiers to which the gain control signal $V_{gcin}$ is supplied. A speed-up control signal 252 provides a pulse in response to a change in the gain control signal $V_{gcin}$. The duration of the pulse is controlled to provide sufficient time to operate a filter in a mode (e.g., a speed-up mode) that facilitates rapid settling an amplifier output signal due to glitches that can occur when the gain of an associated amplifier changes.

Also illustrated in FIG. 6 are representations of delayed versions of the gain control signal $V_{gc}$, indicated as 254 and 256. For example, the gain control signal 254 represents a signal provided by a LPF, such as based on a gain control input signal from a digital section of a receiver. Similarly, the gain control signal 256 represents a signal provided by a delay component, such as based on a gain control input signal from a digital section of a receiver. Each of the gain control signals 254 and 256 generally tracks the voltage level of the gain control signal 250. For example, if the input gain control signal 250 varies between voltages V1 and V2, the gain control signals 254 and 256 also vary between approximately the same (or proportional to) voltages V1 and V2 as the gain control signal $V_{gc}$. However, the gain control signals 254 and 256 impose a desired amount of delay relative to changes in the input gain control signal 250.

The gain control signal 254 provided by the LPF is illustrated as having a slower change relative to the gain control signal 256 provided by the delay component. However, the end result is substantially the same, namely, that the gain control signals 254 and 256 reach the level V2 during the speed-up control signal 252 (e.g., generally midway through the speed-up control signal). In this way, the gain of the amplifier(s) can change while the filter(s) is operating in its speed-up mode according to the speed-up control signal 252, and, in turn, reduce settling time for amplifier signals caused by gain changes in the amplifier.

Figure 7:
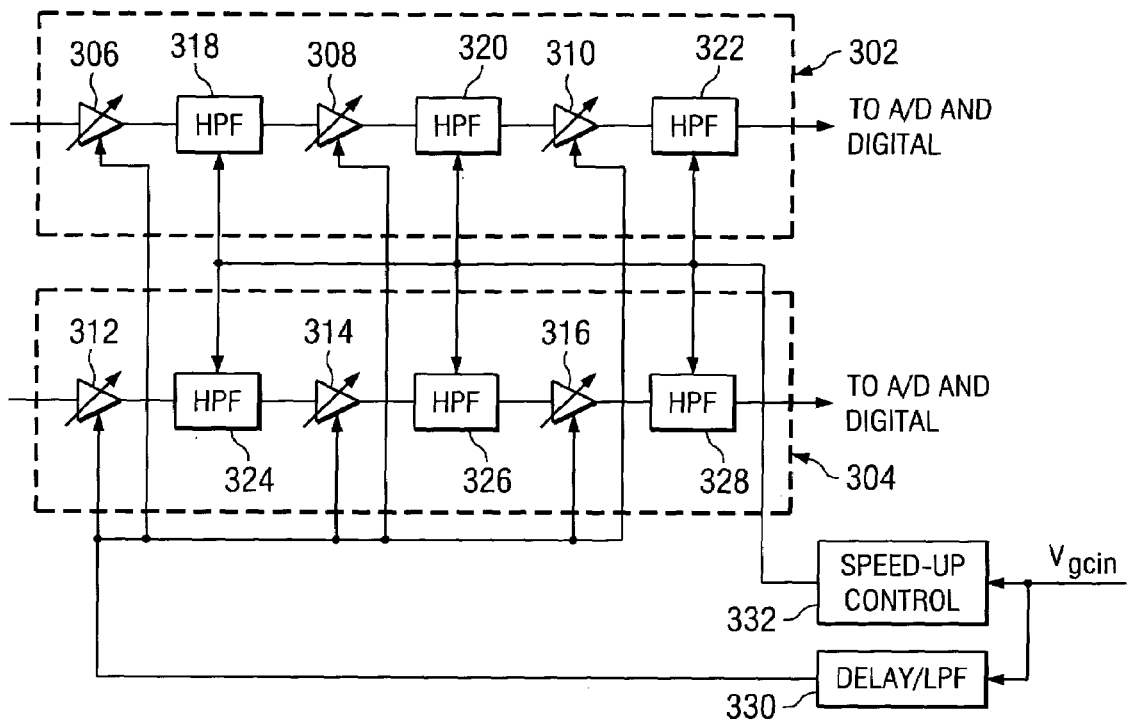
FIG. 7 is an example of a speed-up control system and associated amplifier-filter network in accordance with an aspect of the present invention.

FIG. 7 illustrates an example of part of a direct conversion receiver 300 that implements speed-up control in accordance with an aspect of the present invention. The illustrated part of the receiver 300 includes a pair of amplifier/filter networks 302 and 304 that process input signals (e.g., quadrature signals) from an associated receiver front end. Each network 302, 304 includes a cascade of AC coupled variable gain amplifiers 306, 308, 310 and 312, 314, 316, respectively. In particular, the amplifiers 306, 308 and 310 are AC coupled via HPFs 318, 320 and 322 and the amplifiers 312, 314 and 316 are AC coupled via HPFs 324, 326, and 328. The amplifiers receive a gain control signal from a delay/LPF 330, which gain control signal is generated based on a gain control signal from associated digital circuitry (e.g., an application processor). That is the gain control signal from the delay/LPF corresponds generally to a delayed version of the input gain control signal from the digital circuitry.

The HPFs are configured to provide desired filtering of the amplifier output signals. The HPFs, for example, are configured to filter the amplifier signals with an adjustable corner frequency. Each of the HPFs 318–328 operates in a normal operating mode having a low-corner frequency, which can be selected according to an acceptable signal loss at low frequencies. Each of the HPFs 318–328 also can operate in a speed-up mode in which its associated corner frequency is temporarily increased. The operating mode of the HPFs 318–328 is controlled based on a speed-up mode input signal $V_{spd\_up}$ generated by speed-up control 332 implemented in accordance with an aspect of the present invention. The speed-up control 332 generates a pulse of fixed duration for causing the HPFs to operate in a speed-up mode for a defined time period in response to detected changes in the input gain control signal from the digital circuitry. The change can be a change from a LOW level to a HIGH level as well as from a HIGH level to a LOW level.

Thus, in accordance with an aspect of the present invention, the gain control applied to the amplifiers and the mode control of the HPFs can be derived from a common gain control signal provided by associated digital circuitry, as described herein. As a result, separate signals (and associated pins) are not required to implement desired gain control and speed-up control in accordance with an aspect of the present invention. While three amplifier/filter pairs are illustrated as forming each of the networks 302 and 304 in FIG. 7, it is to be understood and appreciated that any suitable number (e.g., one or more) of such pairs can take advantage of speed-up control implemented in accordance with an aspect of the present invention.

Figure 8:
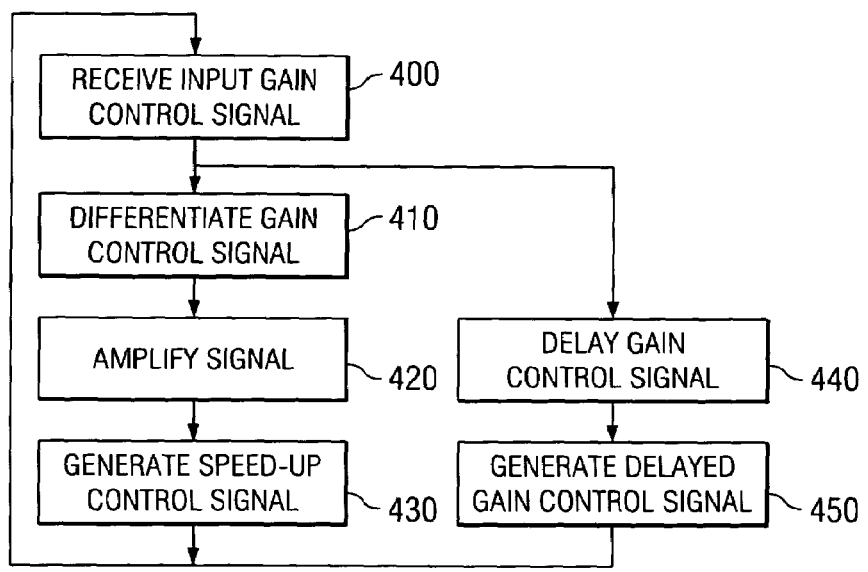
FIG. 8 is a flow diagram for a methodology of implementing speed-up control in accordance with an aspect of the present invention.

In view of the foregoing structural and functional features described above, a methodology in accordance with various aspects of the present invention will be better appreciated with reference to FIG. 8. FIG. 8 illustrates a methodology for implementing analog speed-up control for a receiver circuit in accordance with an aspect of the present invention. It is to be appreciated that not all illustrated features may be required to implement a methodology in accordance with an aspect the present invention. Circuitry operative to perform such methodology can be implemented as an integrated circuit, which advantageously reduces the required number of pins when compared to comparable conventional circuits.

The methodology begins at 400 in which an input gain control signal is received. The gain control signal, for example, is provided by a digital portion of the receiver circuit based on one or more signals provided from an analog baseband portion. In one aspect of the present invention, the methodology of FIG. 8 is implemented as residing in an integrated circuit that forms at least part of the analog portion of the receiver.

Next, at 410, the gain control signal is differentiated to produce a spike in response to changes in the gain control signal. At 420, the differentiated signal is then amplified to a useable level. Then, at 430, a speed-up control signal is generated based on the amplified signal. For example, the amplified signal can be provided to a pulse generator, such as a monoshot oscillator, for producing a pulse signal of a fixed duration corresponding to the speed-up control signal. It is to be understood and appreciated that other types of circuitry also could be utilized to generate a desired pulse. The signal generated at 430 can be provided to a high-pass filter to control operating characteristics of the filter in accordance with an aspect of the present invention.

Next, at 440, the gain control signal is delayed, such as by imposing desired delay by a delay circuit or a LPF. After imposing the delay, a corresponding gain control signal is generated at 450. It is to be understood that the generation of the gain control signal at 450 and the speed-up control signal at 430 can be implemented concurrently or either signal can be generated first, in accordance with an aspect of the present invention. From each of 430 and 450, the methodology repeats, such as by returning to 400 to receive an input gain control signal from associated digital circuitry (e.g., a DSP).

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An analog speed-up and gain control system, comprising:
   a speed-up circuit that receives a gain control input signal from associated digital circuitry and generates a speed-up control signal in response to changes in the gain control input signal;
   delay circuitry that receives the gain control input signal and outputs a delayed gain control signal according to the gain control input signal; and
   the speed up circuit further comprising:
     a differentiator that receives the gain control signal and provides a differentiated signal as a function of the gain control signal; and
     a pulse generator that generates the speed-up control signal based on the differentiated signal indicating a change in the gain control signal.

2. The system of claim 1, the speed-up control signal comprising a pulse of a fixed duration.

3. The system of claim 1, further comprising an amplifier operatively coupled between the differentiator and the pulse generator, the amplifier being operative to amplify the differentiated signal and provide a corresponding amplified signal to the pulse generator.

4. The system of claim 1, the pulse generator further comprising a monoshot oscillator.

5. The system of claim 1 in combination with a filter network, the filter network comprising at least one variable gain amplifier operative to amplify an input signal according to a gain selected based on the delayed gain control signal.

6. The combination of claim 5, the filter network further comprising at least one filter operatively coupled to receive the amplified signal from the amplifier, the associated filter having a filtering characteristic that varies based on the speed-up control signal.

7. The combination of claim 6, the filter comprising a high-pass filter.

8. The combination of claim 7, the filtering characteristic comprising a corner frequency of the high-pass filter.

9. The combination of claim 5 implemented as an analog section of a direct conversion receiver.

10. A direct conversion receiver, comprising:
    a variable gain amplifier operative to amplify an input signal derived from a radio frequency (RF) signal, the gain of the amplifier being adjustable based on a gain control signal from an associated digital system;
    a filter operative to filter an amplified signal of the amplifier and provide a filtered output signal;
    a speed-up control system that generates a speed-up control signal in response to changes in the gain control signal from the associated digital system and, the speed-up control system providing the speed-up control signal to the filter to adjust filter characteristics of the filter; and the speed-up control system further comprising:
- a differentiator that differentiates the gain control signal and provides a corresponding differentiated signal; and
- a pulse generator that generates a pulse signal in response to the differentiated signal so as to indicate a change in the gain control signal.

11. The system of claim 10, the speed-up control signal comprising the pulse signal, the pulse signal having a fixed duration.

12. The system of claim 10, further comprising an amplifier operatively coupled between the differentiator and the pulse generator, the amplifier being operative to amplify the differentiated signal and provide a corresponding amplified signal to the pulse generator.

13. The system of claim 10, the pulse generator further comprising a monoshot oscillator.

14. The system of claim 10, further comprising a delay system operative to impose a delay associated with changes in the gain control signal and provide a corresponding delayed gain control signal to adjust the gain of the variable gain amplifier.

15. The system of claim 14, the delay system comprising a low pass filter.

16. An analog speed-up control system for a direct conversion receiver, comprising:
- a differentiator that receives a gain control signal from associated digital controls and provides a differentiated signal as a function of the gain control signal; and
- a pulse generator that generates the speed-up control signal based on the differentiated signal so as to control a filter characteristic of at least one associated filter.

17. The system of claim 16, the speed-up control signal comprising a pulse of a fixed duration.

18. The system of claim 16, further comprising an amplifier operatively coupled between the differentiator and the pulse generator, the amplifier being operative to amplify the differentiated signal and provide a corresponding amplified signal to the pulse generator.

19. The system of claim 16, the pulse generator further comprising a monoshot oscillator.

20. A method for implementing speed-up mode control for an analog portion of a direct conversion receiver based on an input gain control signal provided by an associated digital portion the receiver, the method comprising:
- differentiating the input gain control signal to provide a differentiated signal;
- generating a speed-up control signal based on the differentiated signal indicating a change in the input gain control signal; and
- controlling a filter characteristic of at least one filter of the analog portion based on the speed-up control signal.

21. The method of claim 20, further comprising delaying the input gain control signal and generating a corresponding delayed gain control signal for controlling at least one amplifier of the analog portion.

* * * * *